(12) United States Patent
Wendler et al.

(10) Patent No.: US 8,093,909 B2
(45) Date of Patent: Jan. 10, 2012

(54) METHOD AND DEVICE FOR MEASURING PHASE NOISE

(75) Inventors: Wolfgang Wendler, Groebenzell (DE); Alexander Roth, Dorfen (DE); Hagen Eckert, Mering (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 658 days.

(21) Appl. No.: 12/301,966

(22) PCT Filed: Feb. 7, 2008

(86) PCT No.: PCT/EP2008/000955
§ 371 (c)(1),
(2), (4) Date: Nov. 21, 2008

(87) PCT Pub. No.: WO2008/110237
PCT Pub. Date: Sep. 18, 2008

(65) Prior Publication Data
US 2010/0048143 A1 Feb. 25, 2010

(30) Foreign Application Priority Data
Mar. 13, 2007 (DE) .......................... 10 2007 012 122

(51) Int. Cl.
*G01R 29/26* (2006.01)
(52) U.S. Cl. ................... 324/613; 324/76.19; 324/76.33
(58) Field of Classification Search .................. None
See application file for complete search history.

(56) References Cited

U.S. PATENT DOCUMENTS
5,179,344 A 1/1993 Najle et al.
6,735,538 B1 5/2004 Yamaguchi et al.
7,116,092 B2 * 10/2006 Jenkins et al. ............. 324/76.19
2005/0238094 A1 10/2005 Bessho et al.
2006/0209942 A1 9/2006 Onuma et al.

FOREIGN PATENT DOCUMENTS
DE 101 14 410 10/2001
DE 10 2005 017 217 11/2005

OTHER PUBLICATIONS
International Search Report for PCT/EP2008/000955 dated Jun. 11, 2008.

* cited by examiner

*Primary Examiner* — Minh N Tang
(74) *Attorney, Agent, or Firm* — Marshall, Gerstein & Borun LLP

(57) ABSTRACT

A method and a device for measuring the phase noise of a signal registers the measurement signal (V) with a given measurement frequency ($f_1$) and with a superimposed phase noise ($f_1(t)$), divides the measurement signal (V) into a first and second measurement signal ($V_1'$, $V_2'$), derives a first signal ($V_1$) with a first frequency (($f_1+f_1(t)$)/N) reduced relative to the measurement frequency ($f_1$) and the superimposed phase noise ($f_1(t)$) and a second signal ($V_2$) with a second frequency (($f_1+f_1(t)$)/M) reduced relative to the measurement frequency ($f_1$) and the superimposed phase noise ($f_1(t)$), determines a third signal ($V_3$) with a third frequency ($f_3(t)$) compensated by the measurement frequency ($f_1$) relative to the first frequency (($f_1+f_1(t)$)/N) of the first signal ($V_1$) and a fourth signal ($V_4$) with a fourth frequency ($f_4(t)$) compensated by the measurement frequency ($f_1$) relative to the second frequency (($f_1+f_1(t)$)/M) of the second signal ($V_2$) and determines a correlation spectrum from the third and fourth signal ($V_3$, $V_4$). The frequencies of the third and fourth signal ($V_3$, $V_4$) come to be disposed in each case within the frequency range of the correlation spectrum as a result of the frequency division of the frequency ($f_1+f_1(t)$) of the first and second measurement signal ($V_1'$, $V_2'$).

12 Claims, 5 Drawing Sheets

(Stand der Technik)

(Stand der Technik)

METHOD AND DEVICE FOR MEASURING PHASE NOISE

BACKGROUND OF THE INVENTION

1. Field of the Invention

The invention relates to a method and a device for measuring the phase noise of a signal.

2. Related Technology

According to the prior art, the phase noise of a signal source, for example, a frequency oscillator, is measured with a device corresponding to FIG. 1.

For this purpose, the frequency signal generated by the signal source 1 with a basic frequency $f_1$ and a phase noise $f_1(t)$ superimposed on this basic frequency $f_1$ is mixed in a mixer 2 with the reference-frequency signal generated by a reference-signal source 3 with a basic frequency $f_2$. A signal component with a frequency, which corresponds to the addition of the frequencies of the frequency signal generated by the signal source 1 and the frequency signal generated by the reference-signal source 3, and a signal component with a frequency, which corresponds to the subtraction of the frequencies of the frequency signal generated by the signal source 1 and of the frequency signal generated by the reference-signal source 3 are disposed at the output of the mixer 2. In a low-pass filter 4 connected downstream of the mixer 2, the signal component with the additive combination of frequencies of the signal source 1 and the reference-signal source 3 is screened out. The signal component of the subtracted combination of the frequencies of the signal source 1 and of the reference-signal source 3 is supplied as the control difference of a phase-locked loop to the controlled reference-signal source 3 for minimization. In the settled condition of the phase-locked loop, the basic frequency $f_2$ of the reference-frequency signal corresponds to the basic frequency $f_1$ of the frequency signal, so that a signal with a frequency corresponding to the phase noise $f_1(t)$ is disposed at the output of the low-pass filter 4

The disadvantage with a device of this kind for measuring the phase noise of a signal is the fact that the reference-frequency signal generated by the reference-signal source 3 is also contaminated with a phase noise $f_2(t)$, which is undesirably superimposed on the phase noise $f_1(t)$ of the signal source 1 in the signal at the output of the low-pass filter 4.

In order to overcome this significant disadvantage, the specification US 2005/0238094 A1 discloses a method and a device for measuring phase noise, which are based on a correlation analysis. The measurement signal V generated by a signal source 100 with a given frequency $f_1$ to be measured and a superimposed phase noise $f_1(t)$ is subdivided in a downstream distributor 105 into a first measurement signal $V_1'$ in a first signal path and a second measurement signal $V_2'$ in a second signal path. The first or respectively second measurement signal $V_1'$ or $V_2'$ is converted in each case in a mixer 180 or 190 into a first or respectively second signal $V_1$ or $V_2$ in each case with reduced frequency. The mixer frequency of the first and second mixer 180 and 190 are generated in each case by a local oscillator 181 and 191.

The first signal $V_1$ is supplied to a first phase-locked loop 110, consisting of a first mixer 111, a subsequent, first low-pass filter 112 and a controlled, first reference-signal source 113 corresponding to the first phase-locked loop in FIG. 1, in order to generate a third signal $V_3$ with a third frequency $f_3(t)$ compensated by the measurement frequency $f_1$ relative to the first frequency $(f_1+f_1(t))/N$ of the first signal $V_1$. The third frequency $f_3(t)$ contains the phase noise $f_1(t)$ of the signal source 100 and the phase noise $f_{21}(t)$ of the controlled, first reference-signal source 113. The second signal $V_2$ is supplied in a similar manner to a second phase-locked loop 120, consisting of a second mixer 121, a subsequent, second low-pass filter 122 and a controlled, second reference-signal source 123 in order to generate a fourth signal $V_4$ with a fourth frequency $f_4(t)$ compensated by the measurement frequency $f_1$ relative to the second frequency $(f_1+f_1(t))/M$ of the second signal $V_2$. The fourth frequency $f_4(t)$ contains the phase noise $f_1(t)$ of the signal source 100 and the phase noise $f_{22}(t)$ of the controlled, second reference-signal source 123.

After an analog/digital conversion of the third signal $V_3$ in a first analog/digital converter 150 and, based upon the latter, a Fourier analysis of the digitized third signal $V_3$ in a first Fast-Fourier transformer 151 (FFT), and in a corresponding manner, an analog/digital conversion of the fourth signal $V_4$ in a second analog/digital converter 160 and, based upon the latter, a Fourier analysis of the digitized fourth signal $V_4$ in a second Fast-Fourier transformer 161, the associated correlation spectrum is calculated from the two Fourier spectra of the third and fourth signals $V_3$ and $V_4$ in a downstream correlator 170.

An averaging unit 171 disposed downstream of the correlator 140 implements an averaging over time of the correlation spectra calculated in the correlator 170 over a sufficiently long time interval T. The averaging result contains only the spectral components of the phase noise $f_1(t)$ contained in the third and fourth signal $V_3$ and $V_4$ of the signal source 100, but not the spectral components of the phase noise $f_{21}(t)$ and $f_{22}(t)$ of the controlled first and second reference-signal source 113 and 123 also contained in the third and fourth signal $V_3$ and $V_4$ and not correlated with one another.

In this context, the use of a mixer for frequency reduction in order to achieve a frequency expansion of the phase noise $f_1(t)$ to be measured within the limited frequency-measurement range of the correlator represents a comparatively cost-intensive realization.

SUMMARY OF THE INVENTION

The invention therefore provides a further developed method and a device for measuring the phase noise of a signal in such a manner that the frequency reduction of the two measurement signals is realized with the minimum possible cost in order to achieve a frequency expansion of the phase noise $f_1(t)$ to be measured within the limited frequency-measurement range of the correlator.

Accordingly, the invention provides a method for measuring the phase noise of a signal, comprising:
  registering a measurement signal (V) with a given measurement frequency ($f_1$) and with a superimposed phase noise ($f_1(t)$),
  subdividing the measurement signal (V) into a first measurement signal ($V_1'$) and a second measurement signal ($V_2'$) in each case with the given measurement frequency ($f_1$) and with the superimposed phase noise ($f_1(t)$),
  deriving a first signal ($V_1$) from the first measurement signal ($V_1'$) with a first frequency (($f_1+f_1(t))/N$) reduced by frequency reduction relative to the measurement frequency ($f_1$) and the superimposed phase noise ($f_1(t)$),
  deriving a second signal ($V_2$) from the second measurement signal ($V_2'$) with a second frequency (($f_1+f_1(t))/M$) reduced by frequency reduction relative to the measurement frequency ($f_1$) and the superimposed phase noise ($f_1(t)$), determining a third signal ($V_3$) with a third frequency ($f_3(t)$) compensated by the measurement frequency ($f_1$) relative to the first frequency (($f_1+f_1(t)$)/N) of the first signal ($V_1$), determining a fourth signal ($V_4$) with a fourth frequency ($f_4(t)$) compensated by the measurement frequency ($f_1$) relative to the second frequency (($f_1+f_1(t)$)/M) of the second signal ($V_2$), and determining a correlation spectrum from the third and fourth phase signal ($V_3$, $V_4$), wherein the frequency reduction is implemented by frequency division of the frequency ($f_1+f_1(t)$) of the first and second measurement signal ($V_1'$, $V_2'$), so that the third and fourth frequency ($f_1(t)/N$), $f_1(t)/M$) of the third and fourth signal ($V_3'$, $V_4'$) comes to be disposed in each case within the frequency range of the correlation spectrum.

The invention further provides a device or measuring the phase noise of a measurement signal (V) of a signal source with a given measurement frequency ($f_1$) and with a superimposed phase noise ($f_1(t)$), comprising:

a distributor for generating a first and a second measurement signal ($V_1'$, $V_2'$) from the measurement signal (V), a first unit for reducing the measurement frequency ($f_1$) and the phase noise ($f_1(t)$) of the first measurement signal ($V_1'$) to a first frequency (($f_1+f_1(t)$)/N) of a first signal ($V_1$), a second unit for reducing the measurement frequency ($f_1$) and the phase noise ($f_1(t)$) of the second measurement signal ($V_2'$) to a second frequency (($f_1+f_1(t)$)/M) of a second signal ($V_2$), a first phase-locked loop for determining a third signal ($V_3$) with a third frequency ($f_3(t)$) compensated by the measurement frequency ($f_1$) relative to the first frequency (($f_1+f_1(t)$)/N) of the first signal ($V_1$), a second phase-locked loop for determining a fourth signal ($V_4$) with a fourth frequency ($f_4(t)$) compensated by the measurement frequency ($f_1$) relative to the second frequency (($f_1+f_1(t)$)/M) of the second signal ($V_2$), and a correlator for determining the correlation spectrum from the third and fourth phase signal ($V_3$, $V_4$), wherein the first or respectively second unit for reducing the frequency ($f_1+f_1(t)$) of the first or respectively second measurement signal ($V_1'$, $V_2'$) is a first or second frequency divider.

According to the invention, the frequency reduction of the first and second measurement signal $V_1$ and $V_2'$ is realized with a frequency divider instead of a mixer. The solution by a frequency divider does not require a cost-intensive local oscillator as in the context of a mixer and is therefore significantly less costly.

Feedback, edge-triggered D flip-flops, which are cascaded with one another dependent upon the division factor to be realized, are used as frequency dividers for a division factor of two and integer multiples of two.

In the most general case, the frequency division of the frequency $f_1+f_1(t)$ of the first measurement signal $V_1'$ is implemented into a first frequency ($f_1+f_1(t)$)/N, while the frequency division of the frequency $f_1+f_1(t)$ of the second measurement signal $V_2'$ is implemented into a second frequency ($f_1+f_1(t)$)/M.

A crosstalking of the first or second signal $V_1$ or $V_2$ between the first and second signal path is prevented with different division factors N and M.

In the case of identical division factors N and M, the phases of the first and second signal $V_1$ and $V_2$, which each contain the phase noise $f_1(t)$ of the signal source, must be synchronized, in order to avoid impairing the correlation result for the determination of the phase noise $f_1(t)$ of the signal source through a phase offset between the third and fourth signal $V_3$ and $V_4$ feeding into the correlation. In this context, a synchronization can alternatively be implemented on a positive or negative edge of the first and second measurement signal $V_1'$ and $V_2'$ to be divided in its frequency.

For the synchronization, the phases of the first and second signal $V_1$ and $V_2$ at the output of the respective frequency divider are compared with one another and, in the case of a phase difference $\Delta\phi$, the individual trigger circuits cascaded in the respective frequency divider are reset via a resetting logic circuit, in each case via the reset input. This targeted, synchronous resetting of all cascaded D flip-flop circuits of the two frequency dividers determines a mutually-synchronous phase of the first and second frequency-reduced signal $V_1$ and $V_2$ at the output of the respective frequency divider.

BRIEF DESCRIPTION OF THE DRAWINGS

An embodiment of the method according to the invention and the device according to the invention for measuring the phase noise of signal is explained in detail below with reference to the drawings. The drawings are as follows.

DETAILED DESCRIPTION

Figure 1:
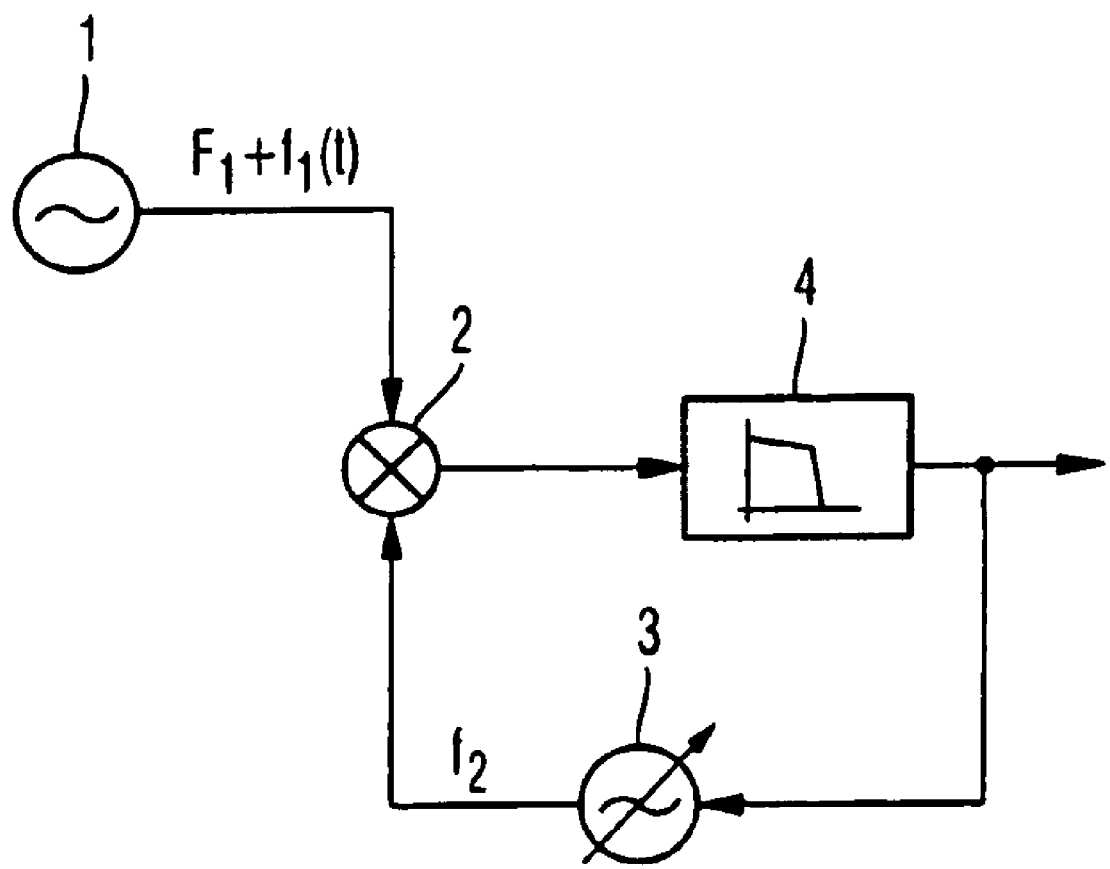
FIG. 1 shows a block-circuit diagram of a device for measuring the phase noise of a signal source according to the prior art.
Figure 2:
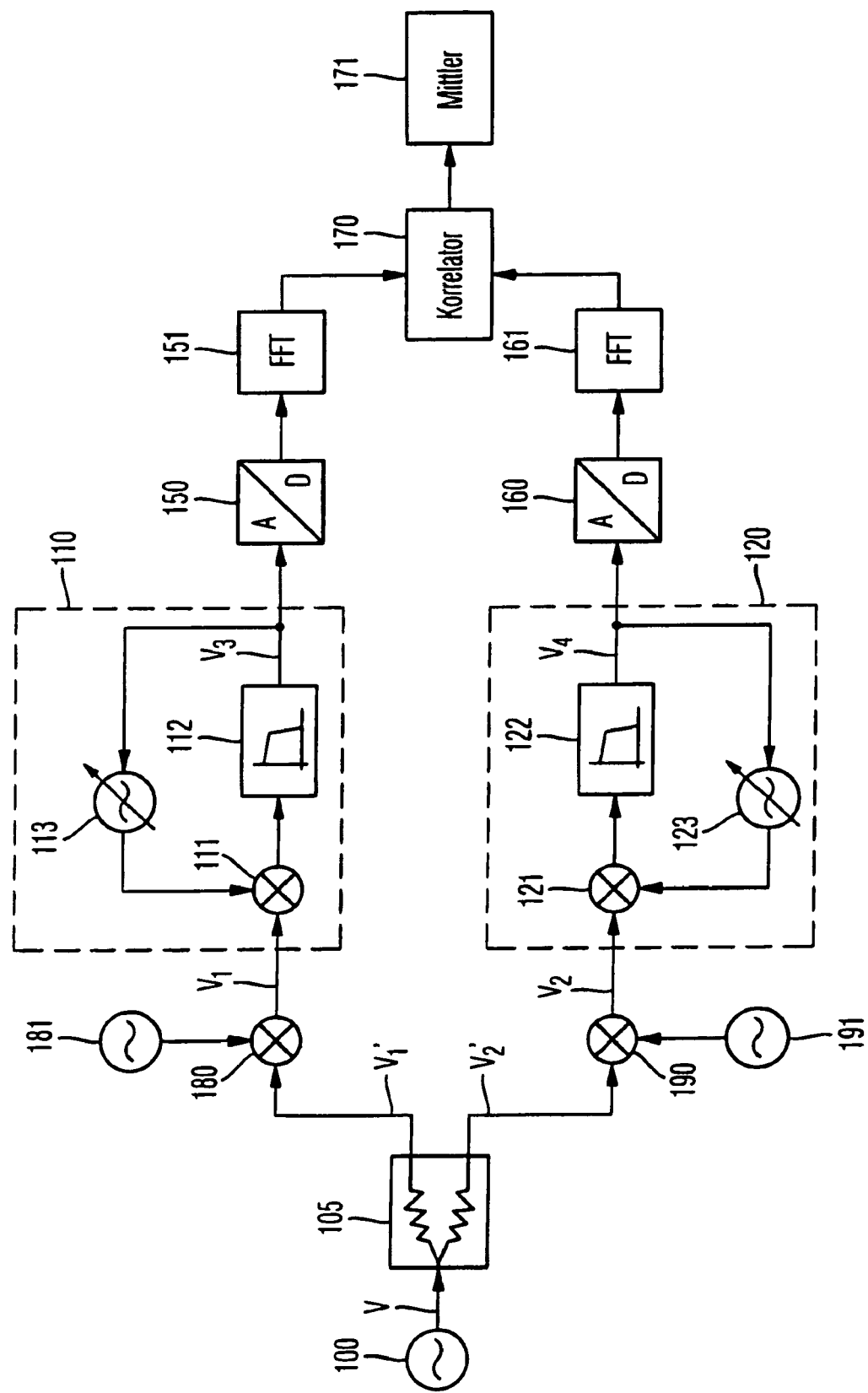
FIG. 2 shows a block-circuit diagram of a device for measuring the phase noise of a signal source by means of correlation analysis according to the prior art.
Figure 3:
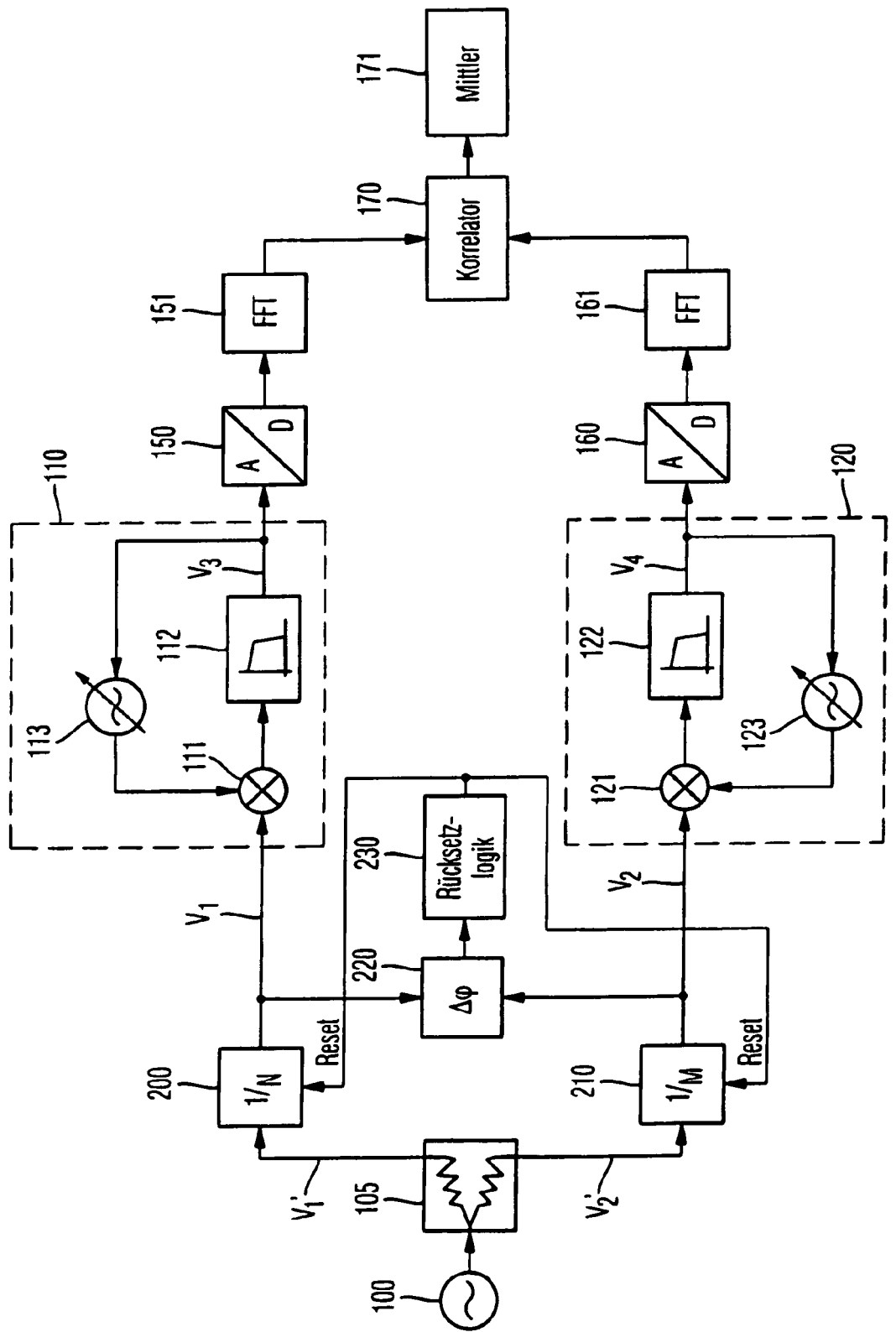
FIG. 3 shows a block-circuit diagram of a device according to the invention for measuring the phase noise of a signal.

The device according to the invention for measuring the phase noise of a signal, as shown in FIG. 3, in each case contains a first and second frequency divider 200 and 210 instead of the first and second mixer 180 and 190 of the device for measuring the phase noise of a signal according to the prior art, as shown in FIG. 2. The device according to the invention includes the other device features of the device for measuring the phase noise of a signal according to the prior art, but such features are shown with the same reference numbers and are therefore not described again in detail.

The first frequency divider 200 divides the measurement frequency $f_1$ and the superimposed phase noise $f_1(t)$ of the first measurement signal $V_1'$ at its input by the integer division factor N into a first frequency ($f_1+f_1(t)$)/N of the first signal $V_1$ at its output. In a similar manner, the second frequency divider 210 divides the measurement frequency $f_1$ and the superimposed phase noise $f_1(t)$ of the second measurement signal $V_2'$ at its input by the integer division factor M into a second frequency ($f_1+f_1(t)$)/M of the second signal $V_2$ at its output.

Typically, but not necessarily, the division factor N of the first frequency divider 200 differs from the division factor M of the second frequency divider 210, in order to prevent a crosstalking of the first and second signal $V_1$ and $V_2$ between the first and second signal path. However, the case of an identical division factor N and M of the first and second frequency divider 200 and 210 is also covered by the invention.

Figure 4A:
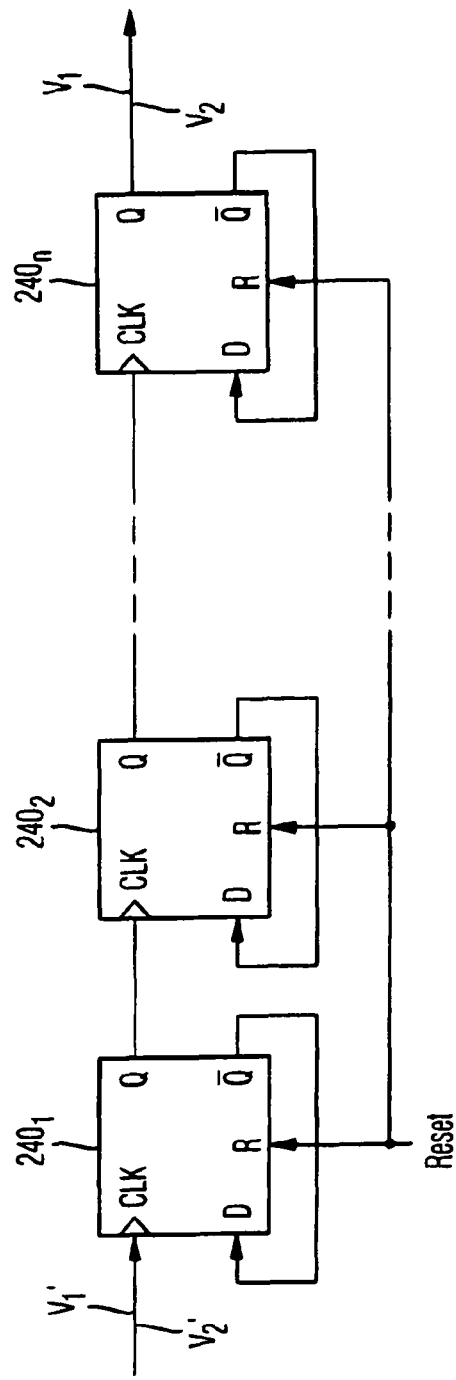
FIGS. 4A, 4B show a block-circuit diagram of the frequency divider with phase synchronization in the case of a positive and negative edge of the input signal.
Figure 4B:
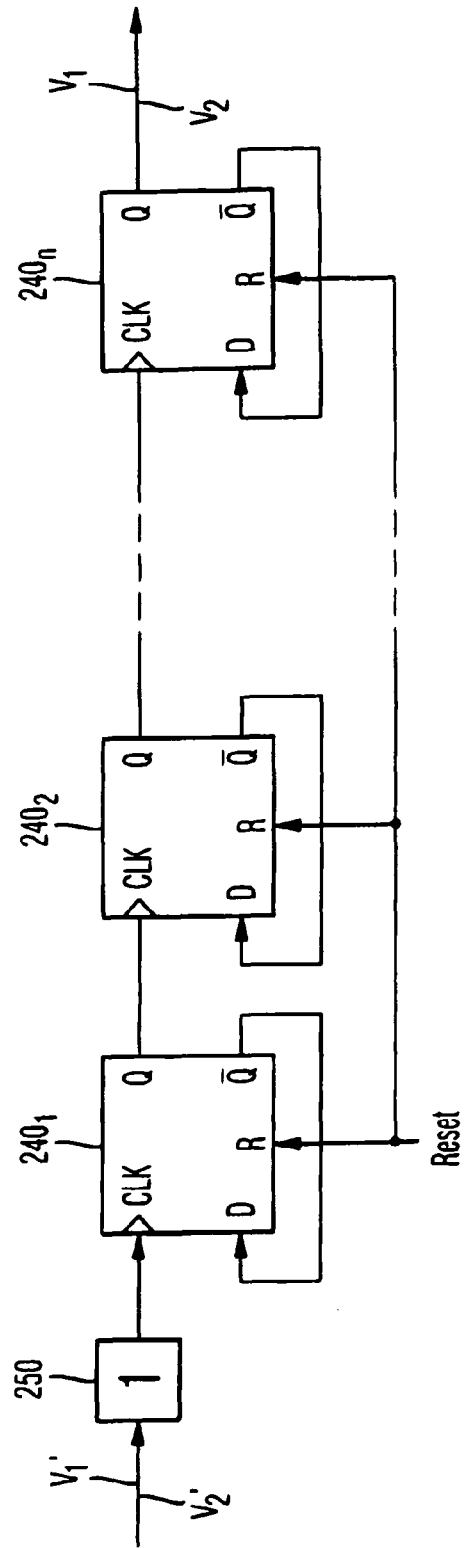

In a first embodiment with a triggering in the case of a positive edge of the first or second measurement signal $V_1'$ or $V_2'$ as shown in FIG. 4A, and in a second embodiment with a triggering in the case of a negative edge of the first or second measurement signal $V_1'$ or $V_2'$ as shown in FIG. 4B, the frequency divider 200 and 210 consists of at least one feedback, edge-triggered triggering circuit, a so-called D flip-flop, which implements a frequency division in each case by the division factor two. With a division factor of an integer multiple of two, a number of feedback, edge-triggered D-flip-flop circuits $240_1$, $240_2$, ..., $240_n$ corresponding to the division factor must be cascaded with one another.

With a triggering of the frequency divider 200 and 210 in the case of a negative edge of the first or second measurement signal $V_1'$ or $V_2'$ as shown in FIG. 4B, an inverter 250, which inverts the respective negative edges of the first or second measurement signal $V_1'$ or $V_2'$ into positive edges and therefore allows the use of a frequency divider with a triggering in the case of a positive edge of the first or second measurement signal $V_1'$ and $V_2'$ according to FIG. 4A, should be connected upstream of the first feedback, edge-triggered D flip-flop circuit $240_1$.

In addition to the frequency division, a synchronization of the phases of the frequency-reduced first and second signal $V_1'$ or $V_2'$ at the respective output of the first and second frequency divider 200 and 210 is implemented in the first and second frequency divider 200 and 210. For this purpose, the two phases of the frequency-reduced first and second signal $V_1'$ and $V_2'$ at the output of the first and second frequency divider 200 and 210 are compared with one another in a phase comparator 220. If there is a phase deviation $\Delta\phi$ between the two phases, a resetting signal, Reset, for resetting all feedback edge-triggered D flip-flop circuits, which are each cascaded with one another in the first and second frequency divider 200 and 210, is generated in a resetting logic circuit 230 connected downstream of the phase comparator 220. The method of functioning of the resetting logic circuit 230 is based substantially on an activation of the Reset signal whenever a threshold value is exceeded by the phase deviation $\Delta\phi$.

Figure 5:
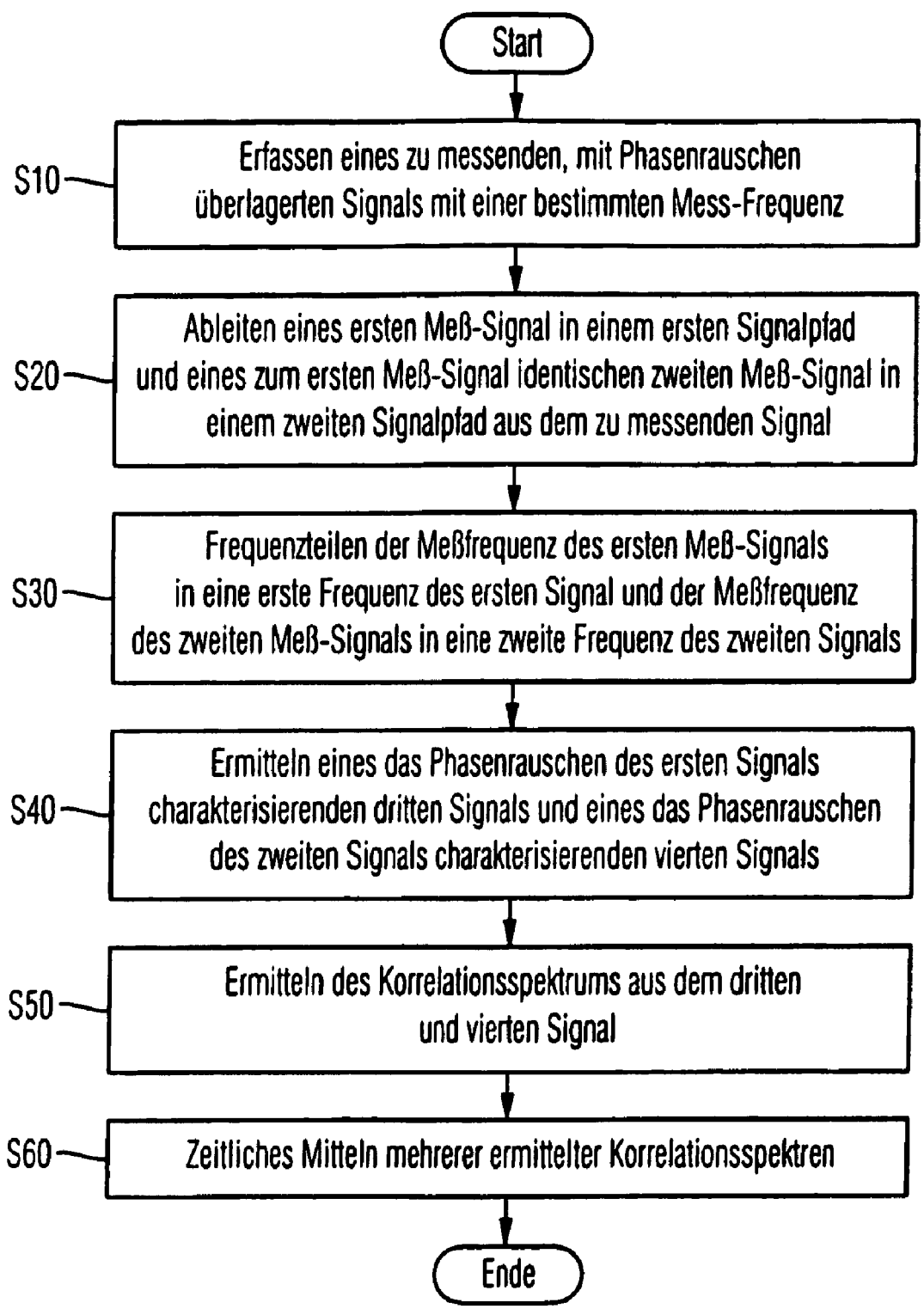
FIG. 5 shows a flow chart for a method according to the invention for measuring the phase noise of a signal.

The following section describes the method according to the invention for measuring the phase noise of a signal with reference to a flow chart as shown in FIG. 5.

In the first procedural stage S10 of the method according to the invention, the measurement signal V with a given measurement frequency $f_1$, on which a phase noise $f_1(t)$ is superimposed, is registered.

In the next procedural stage S20, the signal V to be measured is divided in the divider 105 into a first measurement signal $V_1'$ in a first signal path and a second measurement signal $V_2'$ in a second signal path, which is approximately identical to the first measurement signal $V_1'$.

The next procedural stage S30 contains the frequency division of the frequency $f_1+f_1(t)$ of the first measurement signal $V_1'$ by the division factor N into a first frequency $(f_1+f_1(t))/N$ of the first signal $V_1$ in a first frequency divider 200 and, in a similar manner, the frequency division of the frequency $f_1+f_1(t)$ of the second measurement signal $V_2'$ by the division factor M into a second frequency $(f_1+f_1(t))/M$ of the second signal $V_2$ in a second frequency divider 210.

The value of the division factors N and M is established in such a manner that, on the one hand, the phase-angle deviation determined by a frequency change $\Delta f_1$ of the signal source 100 in a downstream first and second phase-locked loop 110 and 120 does not cause an overdriving of the phase comparator 111 and 121 and does not cause an unsuccessful controlling of the respective phase-locked loop 110 and 120; and, on the other hand, that the frequencies of the third and fourth signal $V_3$ and $V_4$ come to be disposed within the frequency range of the first and second Fast-Fourier transformer 151 and 161.

In the next procedural stage S40, a third and respectively fourth signal $V_3$ and $V_4$ characterizing the phase noise $f_1(t)$ of the signal source 100 are determined, in a downstream first and second phase-locked loop 110 and 120, from the frequency-reduced first and respectively second signal $V_1$ and $V_2$, on which the phase noise $f_{21}(t)$ and respectively $f_{22}(t)$ of the first and second mixer 111 and 121 of the first and second phase-locked loop 110 and respectively 120 is additionally superimposed.

After an analog/digital conversion in a first and second analog/digital converter 150 and 160 and a Fourier analysis in a first and second Fast-Fourier transformer 151 and 161, the Fourier spectra of the third and fourth signal $V_3$ and $V_4$ are supplied, in the next procedural stage S50, to a correlator 170 in order to determine the correlation spectrum with reference to a correlation analysis.

After the calculation of several correlation spectra over a given time interval T, the calculated correlation spectra are supplied, in the final procedural stage S60, for averaging in an averaging unit 171. With the averaging of the correlation spectra over a sufficiently long time interval T, the spectral components of the non-mutually-correlated phase noise $f_{21}(t)$ and $f_{22}(t)$ of the first and second mixer 111 and 121 in the first and second phase-locked loop 110 and 120, in particular, the phase noise of the first and second frequency divider 200 and 210, cancel each other out in the averaged correlation spectrum. The averaged correlation spectrum therefore correctly contains, in amplification, only the spectral components of the phase noise $f_1(t)$ of the signal source 100.

The invention is not restricted to the illustrated embodiment of the method according to the invention and the device according to the invention for measuring the phase noise of a signal. The invention also covers other realization variants for a frequency divider, which are not described here, especially realization variants of a frequency divider with a division factor, which is not equal to two or which is not equal to an integer multiple of two.

The invention claimed is:

1. Method for measuring the phase noise of a signal comprising:

registering a measurement signal with a given measurement frequency and with a superimposed phase noise, subdividing the measurement signal into a first measurement signal and a second measurement signal in each case with the given measurement frequency and with the superimposed phase noise, deriving a first signal from the first measurement signal with a first frequency reduced by frequency reduction relative to the measurement frequency and the superimposed phase noise, deriving a second signal from the second measurement signal with a second frequency reduced by frequency reduction relative to the measurement frequency and the superimposed phase noise, determining a third signal with a third frequency compensated by the measurement frequency relative to the first frequency of the first signal, determining a fourth signal with a fourth frequency compensated by the measurement frequency relative to the second frequency of the second signal, and determining a correlation spectrum from the third and fourth phase, wherein the frequency reduction is implemented by frequency division of the frequency of the first and second measurement signal, so that the third and fourth frequency of the third and fourth signal comes to be disposed in each case within the frequency range of the correlation spectrum.

2. Method for measuring phase noise according to claim 1, wherein the first frequency of the first signal and the second frequency of the second signal are identical.

3. Method for measuring phase noise according to claim 2, comprising in the case of the frequency division of the measurement frequency and of the superimposed phase noise of the first and second measurement signal, synchronizing the phases of the first and second signal with one another.

4. Method for measuring phase noise according to claim comprising in the case of a positive edge of the first and second measurement signal, synchronizing the phases of the first and second signal synchronized.

5. Method for measuring phase noise according to claim 3, comprising in the case of a negative edge of the first and second measurement signal, synchronizing the phases of the first and second signal.

6. Method for measuring phase noise according to claim 1, wherein the first frequency of the first signal and the second frequency of the second signal are a different frequency.

7. Method for measuring phase noise according to claim 1, wherein the determination of the correlation spectrum is followed by a time averaging of correlation spectra following one another in time succession.

8. Device for measuring the phase noise of a measurement signal of a signal source with a given measurement frequency and with a superimposed phase noise, comprising a distributor for generating a first and a second measurement signal from the measurement signal, a first unit for reducing the measurement frequency and the phase noise of the first measurement signal to a first frequency of a first signal, a second unit for reducing the measurement frequency and the phase noise of the second measurement signal to a second frequency of a second signal, a first phase-locked loop for determining a third signal with a third frequency compensated by the measurement frequency relative to the first frequency of the first signal, a second phase-locked loop for determining a fourth signal with a fourth frequency compensated by the measurement frequency relative to the second frequency of the second signal, and a correlator for determining the correlation spectrum from the third and fourth phase signal, wherein the first or respectively second unit for reducing the frequency of the first or respectively second measurement signal is a first or second frequency divider.

9. Device for measuring phase noise according to claim 8, wherein the first and second frequency divider comprises in each case at least one cascaded, feedback, edge-triggered D flip-flop circuit capable of being reset.

10. Device for measuring phase noise according to claim 8, wherein a phase comparator for comparing the phase of the first signal at the output of the first frequency divider with the phase of the second signal at the output of the second frequency divider is connected downstream of the first and second frequency divider.

11. Device for measuring phase noise according to claim 10, wherein in the case of a different phase of the first and second, a reset logic circuit for the synchronous resetting of the edge-triggered D flip-flop circuits cascaded respectively in the first and second frequency divider is connected downstream of the phase comparator.

12. Device for measuring the phase noise of a signal according to claim 8, wherein the triggering of the first or the second frequency divider is implemented in each case in an adjustable manner with a positive or a negative edge of the first or respectively second measurement signal at the input of the first or second frequency divider.

* * * * *